United States Patent [19]

Kawashima et al.

[11] Patent Number: 5,554,973
[45] Date of Patent: Sep. 10, 1996

[54] ELECTROSTATIC CAPACITANCE-TYPE SENSOR

[75] Inventors: Kazunori Kawashima; Hajime Oda; Takahiro Miyajima, all of Chiba-ken, Japan

[73] Assignee: Seikosha Co., Ltd., Tokyo, Japan

[21] Appl. No.: 481,669

[22] Filed: Jun. 7, 1995

[30] Foreign Application Priority Data

Jun. 8, 1994 [JP] Japan .................................. 6-126189

[51] Int. Cl.$^6$ ................................................. G08B 13/26
[52] U.S. Cl. ......................... 340/562; 307/125; 361/179; 361/181
[58] Field of Search .......................... 340/562; 361/181, 361/179; 307/125

[56] References Cited

U.S. PATENT DOCUMENTS

| | | | |
|---|---|---|---|
| 4,001,613 | 1/1977 | Hills et al. | 307/308 |
| 4,055,129 | 10/1977 | Hunts et al. | 112/453 |
| 4,157,539 | 6/1979 | Hunts et al. | 341/33 |
| 5,148,149 | 9/1992 | Campbell et al. | 340/562 |

FOREIGN PATENT DOCUMENTS 63-36246  9/1988  Japan .
2119931  11/1983  United Kingdom .

*Primary Examiner*—Glen Swann
*Attorney, Agent, or Firm*—Jordan and Hamburg

[57] ABSTRACT

A proximity sensor of the electrostatic type has a pulse-generating circuit and first and second delay circuits which are respectively connected to an output of the pulse-generating circuit. The first and second delay circuits are of the integrating type having capacitances which are charged over time. The second delay circuit is a reference circuit and has a delay based on a fixed capacitance. The first delay circuit has its capacitance based on a capacitance of a detection electrode. The first and second delay circuits each have their respective capacitances charged or drained by constant current circuits, each moving the same amount of current. Outputs of the first and second delay circuits are each applied to a respective limiting amplifier such as a Schmitt trigger, each Schmitt trigger then has an output to input to a common phase detector. The phase detector determines the sequence of arrival of pulses generated by the first and second delay circuits. Since the constant current sources charge their respective capacitances in a linear fashion, arrival of noise spikes anytime during the charging period results in consistent errors which are less than errors associated with a noise spike of the same level in the prior art.

9 Claims, 7 Drawing Sheets

ELECTROSTATIC CAPACITANCE-TYPE SENSOR

BACKGROUND OF THE INVENTION

The present invention relates to an electrostatic proximity sensor, and more particularly to an electrostatic capacitance-type proximity sensor having improved noise characteristics. The proximity sensor has an improved range of detection due to the improved noise characteristics of the device. The proximity sensor is used to detect the presence of objects, including human or animal bodies, within a given range.

Conventional electrostatic capacity proximity sensors function on the basis of determining a change in capacity of a detection electrode when objects are near the detection electrode. A proximity sensor of this type is disclosed in Japanese Laid-Open Utility Model Publication No. Sho. 63-36246. The proximity sensor includes a pulse-generating circuit having an output applied to two delay circuits, each having an integrator configuration. A second one of the delay circuits uses a fixed capacitor and serves to create a reference delay. A first one of the delay circuits has a capacitance determined by an electrostatic capacity of the detection electrode. The capacitance of the detection electrode increases when objects are placed proximate the detection electrode. The increase in capacity increases a delay in the first delay circuit. Outputs of the first and second delay circuits are each applied to a limiting amplifier, or Schmitt trigger, which shapes the output into digital pulses. The outputs of the limiting amplifiers are applied to a phase detection circuit which determines the sequence of arrival of rising edges of the respective outputs.

Normally, the second delay circuit serves as a reference and has a longer delay than the first delay circuit when no objects are near the detection electrode. Thus, in a state where no objects are proximate the detection electrode, rising edges of pulses from the first delay circuit arrive at the phase detection before those of the second delay circuit. When an object is disposed near the detection electrode, the delay of the first delay circuit increases such that the sequence of arrival of the rising edges at the phase detector is reversed. When the reversal occurs, the phase detector outputs a high signal indicating that an object is within range of the detection electrode.

Since the first and second delay circuits are of a resistor-capacitor integrator-type configuration, their outputs are based on an exponential function of time. Therefore, the slope of the output curves of the first and second delay circuits is dependent upon a time relative to the beginning of charging of the capacitances of the respective delay circuits. The sensitivity of the proximity sensor is determined in part by the effect of noise disturbance on the output of the delay circuits. Since the outputs of the delay circuits are not linear, and are exponential in nature with respect to time, a given noise spike can produce errors in delays varying with the timing of the noise spike. Therefore, a given noise spike may produce lesser or greater errors based on its timing with respect to the beginning of the integration period. For instance, if the noise spike occurs shortly after the beginning of an integration period, the slope of the output signal is relatively steep and the error caused by the noise spike is minimal. However, should the noise spike occur toward the end of the integration period, the slope of the output at that point is minimal and the recovery from the noise spike becomes protracted. Thus, in order to determine the accuracy and range of the proximity sensor, one must consider the possibility of the noise spike occurring at a time which maximizes the influence of the noise spike on the delay of the delay circuit.

The range of detection of the proximity sensor is determined by the smallest capacitance change that can be reliably detected. Objects distant from the detection electrode produce smaller changes in capacitance than objects near the detection electrode. In the stand-by state, the delay of the reference delay circuit, that is the second delay circuit, is greater than that of the first delay circuit by an amount $\Delta T$ sufficient to prevent noise from producing false triggering. Therefore, a change in capacitance of the detection electrode must be sufficient to overcome the delay $\Delta T$. Thus, a reduction in the required level of the delay $\Delta T$ would increase the detection range of the proximity sensor. Accordingly, it would be desirable to have a constant lower range of error due to noise spikes than the prior art throughout the entire integration period. So long as the error level is less than the error level towards the end of the integration period in conventional circuits, the detection range of the proximity sensor will be improved.

As described above, the sensitivity of a proximity sensor is determined by the minimal phase difference which may be reliably detected. The minimal phase difference which can be detected is, in part, determined by the stability of the delay circuits used in the proximity sensor. Where the error created by a given noise spike depends on the timing of its arrival, the worst case timing will dictate the reliability and range of the proximity sensor. Since errors in delays directly affect errors in phase difference measurement, it would be a welcomed innovation to provide a proximity sensor which has errors due to noise spikes which are independent of the timing of the noise spikes and less than longer delays associated with an equivalent noise spike in a conventional proximity sensor.

SUMMARY OF THE INVENTION

Accordingly, it is an object of the invention to provide a proximity sensor which overcomes the drawbacks of the prior art.

It is a further object of the invention to provide a proximity sensor which has delay circuits that are time insensitive to the arrival of noise spikes.

It is a still further object of the invention to provide a proximity sensor which can detect a minimal phase difference while providing a reliable output.

It is yet another object of the invention to provide a delay circuit which has a constant error in delay for a given noise spike, where that level is less than error levels in the prior art for a noise spike of the same level.

Still another object of the present invention is to ensure that variations in the delay time are regular fixed, and are not dependent on the introduction of noise at a given time, and are so equalized that the phase difference level does not appear to shift.

Briefly stated, the present invention provides a proximity sensor of the electrostatic type having a pulse-generating circuit and first and second delay circuits which are connected to an output of the pulse-generating circuit. The first and second delay circuits are of a linear integrating type having capacitances which are charged over time. The second delay circuit is a reference circuit and has a delay based on a fixed capacitance. The first delay circuit has its capacitance based on a capacitance of a detection electrode.

The first and second delay circuits each have their respective capacitances charged or drained by constant current circuits, each moving the same amount of current. Outputs of the first and second delay circuits are each applied to a respective limiting amplifier such as a Schmitt trigger, each Schmitt trigger then has an output applied to a common phase detector. The phase detector determines the sequence of arrival of pulses generated by the first and second delay circuits. Since the constant current sources charge their respective capacitances in a linear fashion, arrival of noise spikes anytime during the charging period results in consistent errors which are less than errors associated with a noise spike of the same level in the prior art.

In accordance with these and other objects of the invention, there is provided a proximity detector comprising: a pulse generator producing a pulse output; first and second capacitances; the first capacitance including a detection electrode having a capacitance dependent upon a proximity of objects thereto; means for setting the first and second capacitances to a fixed state of charge in response to the pulse output being in a first state; means for linearly altering the fixed state of charge on the first and second capacitances; and means for detecting a difference between a first rate of altering the charge on the first capacitance and a second rate of altering the charge on the second capacitance.

The present invention also provides a proximity detector comprising: a pulse generator; first and second delay circuits receiving an output of the pulse generator and having first and second capacitances respectively; an electrostatic capacitance varying converter connected to at least one of the first and second delay circuits to vary a delay of the at least one delay circuit by varying a respective one of the first and second capacitances; the first and second delay circuits each having a constant current circuit, controlled by the pulse generator, for changing a set state of charge on the first and second capacitances, respectively, in a substantially linear manner; and a phase discrimination circuit for detecting a phase difference between outputs of the first and second delay circuits.

The above, and other objects, features and advantages of the present invention will become apparent from the following description read in conjunction with the accompanying drawings, in which like reference numerals designate the same elements.

DETAILED DESCRIPTION OF THE PREFERRED EMBODIMENT

Figure 7:
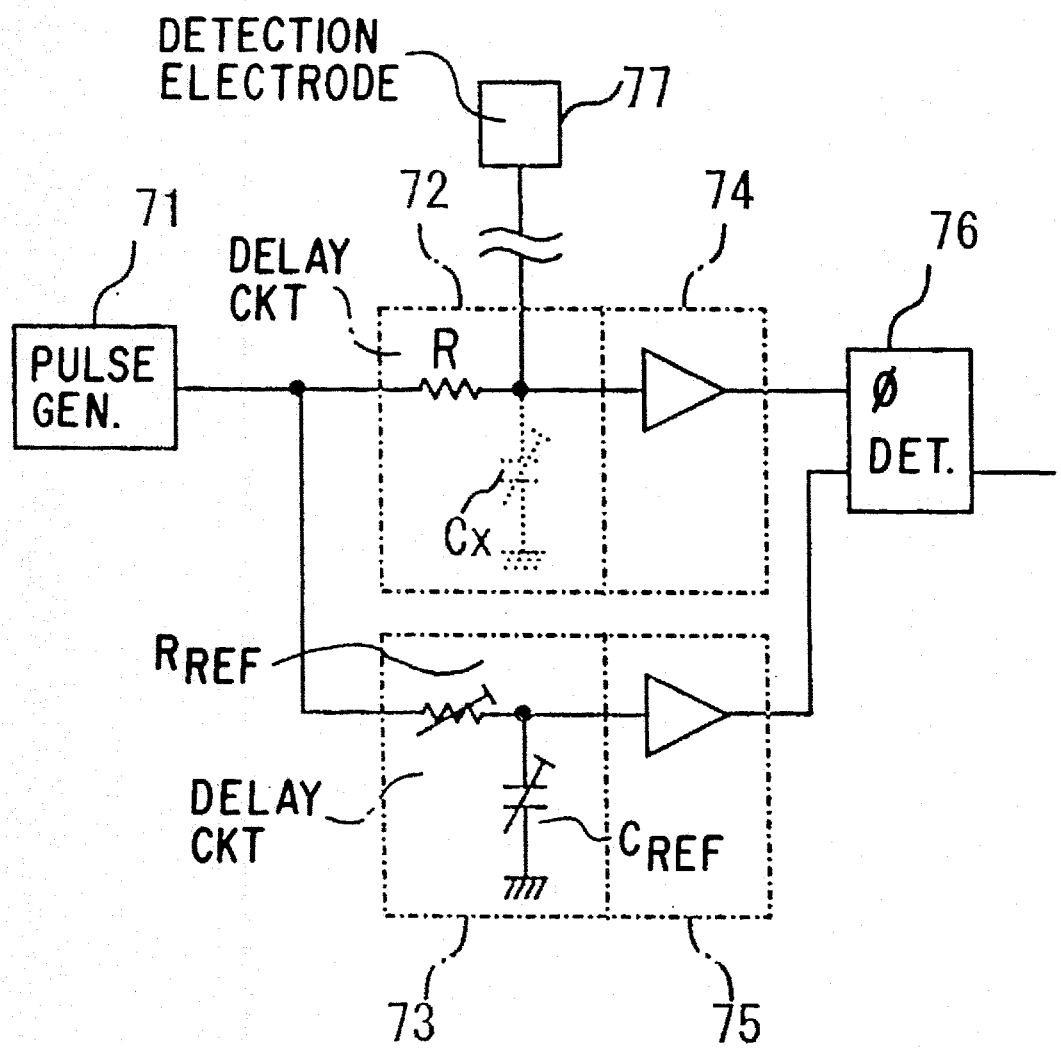
FIG. 7 shows a schematic diagram of a prior art proximity sensor.

Referring to FIG. 7, for the purpose of facilitating description of the present invention, a schematic of a prior art embodiment of a proximity sensor is shown wherein a pulse generator 71 generates pulses which are applied to first and second integrator circuits, 72 and 73, which function as delay circuits. Outputs of the first and second integrator circuits, 72 and 73, are applied to first and second limiting amplifiers 74 and 75. Each of the first and second limiting amplifiers, 74 and 75, have threshold voltages above which a given input will drive the output high. Outputs of the first and second limiting amplifiers, 74 and 75, are applied to a phase detector 76 which generates an output based on a sequence of arrival of rising edges of pulses from the first and second limiting amplifiers, 74 and 75.

The first and second integrator circuits, 72 and 73, are each constructed in a similar manner wherein charge is integrated over time by a capacitor. The first integrator circuit 73 has a variable resistor $R_{ref}$ and a variable capacitor $C_{ref}$. The values of resistor $R_{ref}$ and capacitor $C_{ref}$ determine a charging curve of the capacitor $C_{ref}$ which is the output of the first integrator circuit 73. When a voltage level across capacitor $C_{ref}$ exceeds the threshold voltage of the second limiting amplifier 75, the output of the second limiting amplifier 75, goes high. Thus, a time delay between when the output of the pulse generator 71 goes high and the output of the second limiting amplifier 75 goes High is a function of the values of resistor $R_{ref}$, capacitor $C_{ref}$, and the threshold voltage of the second limiting amplifier 75.

The first integrator circuit 72 has a resistor R and an electrostatic capacitance $C_x$ provided by a detection electrode 77. The electrostatic capacitance $C_x$ of the detection electrode is represented schematically by a variable parasitic capacitance shown by a dashed line. The first integrator circuit 72 functions as does the second integrator circuit 73 with the exception that the capacitor $C_{ref}$ is replaced by the electrostatic capacitance $C_x$ of the detection electrode. When an object is disposed proximate the detection electrode 77, the electrostatic capacitance $C_x$ of the detection electrode increases. The increase in the electrostatic capacitance $C_x$ of the detection electrode increases the period of delay of the first integrator circuit 72. Thus, the delay between when an output pulse of the pulse generator 71 goes high and an output pulse of the first limiting amplifier 74 goes high is dependent upon the proximity of objects to the detection electrode 77.

In a standby mode of operation there are no objects disposed proximate the detection electrode 77 and both the variable resistor $R_{ref}$ and capacitor $C_{ref}$ are adjusted to set the delay generated by the second integrator circuit 73 greater than the delay generated by the first integrator circuit 72. Therefore, pulses arrive at the phase detector 76 from the first limiting amplifier 74 before pulses arrive from the second limiting amplifier 75. That sequence of arrivals produces a low output at the phase detector 76. In the event that an object is disposed close enough to the detection electrode 77 to increase its electrostatic capacitance to a level where the delay of the first integrator circuit 72 is greater than that of the second integrator circuit 73, the sequence of pulse arrivals at the phase detector 76 is reversed and the output of the phase detector 76 goes high.

Figure 6:
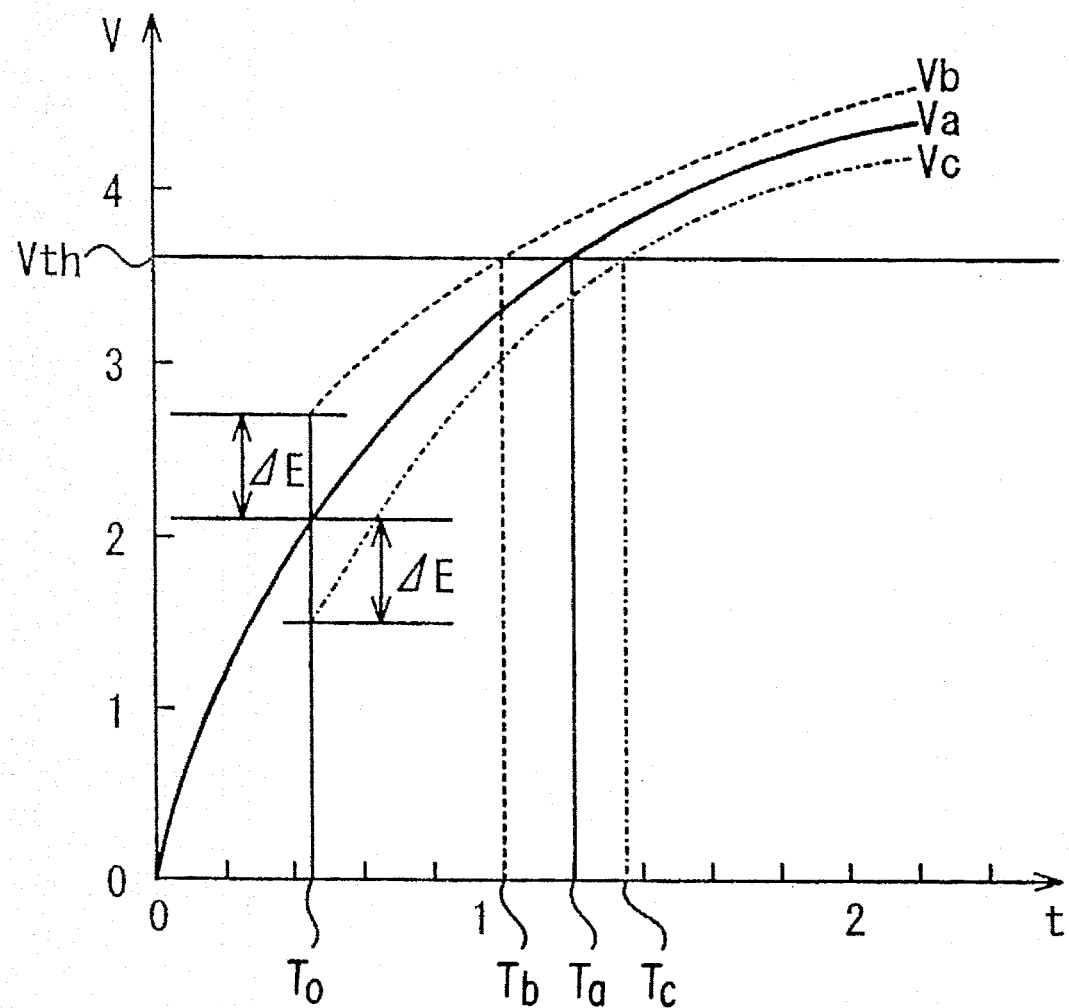
FIG. 6 shows a graph of noise-induced error versus timing of the noise of the prior art.

Referring to FIG. 6, a graph is shown representing the output of an integrating circuit, for example, the first integrator circuit 72, depicting the charge across a capacitance of the integrator circuit with respect to time. The output characteristic of the integrator circuit is determined by the following equation (1):

$$V_a = E(1-\exp[-t/RC]) \qquad (1)$$

where E is power supply voltage, R is a resistance of the integrator circuit, and C is the capacitance of the integrator circuit. In the case of the first integrator circuit 72, the capacitance C is determined by the electrostatic capacitance $C_x$ of the detection electrode 77. The variable t represents the time elapsed since a rising edge of a pulse is applied to the integrator circuit. A level of voltage $V_{th}$ is shown in FIG. 6 representing a threshold voltage of a limiting amplifier or Schmitt trigger following the integrator circuit.

A point in time at which the output voltage of the integrator circuit crosses the level $V_{th}$ determines when the output of the limiting amplifier or Schmitt trigger will go high, and hence the time delay generated by the integrator circuit. For example, the output characteristic $V_a$ corresponds to the integrator circuit generating a delay equal to $T_a$. Likewise, the characteristics represented as $V_b$ and $V_c$ represent delays represented by $T_b$ and $T_c$, respectively. The time delay generated by the integrator circuit is given by the following equation (2):

$$T_a = -RC\ ln([E-V_{th}]/E) \qquad (2).$$

The effect of noise, and in particular noise spikes, on the delay of time introduced by the integrator circuit is now considered. As a reference point, the rising edge of the pulse produced by the pulse generator is considered to be coincident with time 0 on the graph of FIG. 6. Noise spikes occurring in the integrator circuit will alter the level of charge across the capacitor of the integrator circuit. For example, if a positive noise spike, having an amplitude equal to $\Delta E$, occurs at time $T_0$, the output characteristic designated $V_a$ will shift upward and follow the course of the voltage characteristic $V_b$. Since the voltage characteristic $V_b$ is higher than the level of voltage characteristic $V_a$, the characteristic $V_b$ will cross the voltage threshold of $V_{th}$ at time $T_b$ preceding the time $T_a$. Similarly, should the noise spike occur in a negative direction, the voltage characteristic $V_a$ will shift down to the voltage characteristic $V_c$ which will cross the voltage threshold $V_{th}$ at time $T_c$. The crossover time $T_c$ lags behind the crossover time $T_a$. The time period $T_b$ and $T_c$ are given by the following equations, (3 and 4):

$$T_b = T_0 - RC\ ln([E-V_{th}]/(E-E_0-\Delta E)) \qquad (3)$$

$$T_c = T_0 - RC\ ln([E-V_{th}]/(E-E_0+\Delta E)) \qquad (4)$$

where $V_0$ represents the output voltage of $V_a$ at time $T_0$. Thus, the total possible error due to the occurrence of a noise spike having the level $\Delta E$ is the difference $T_c - T_b$ which will be designated $\Delta T$. The time differential $\Delta T$ is a function of time $T_0$ at which time the noise spike occurs. The time differential $\Delta T$ varies in a non-linear manner with respect to the variable $T_0$.

Figure 4:
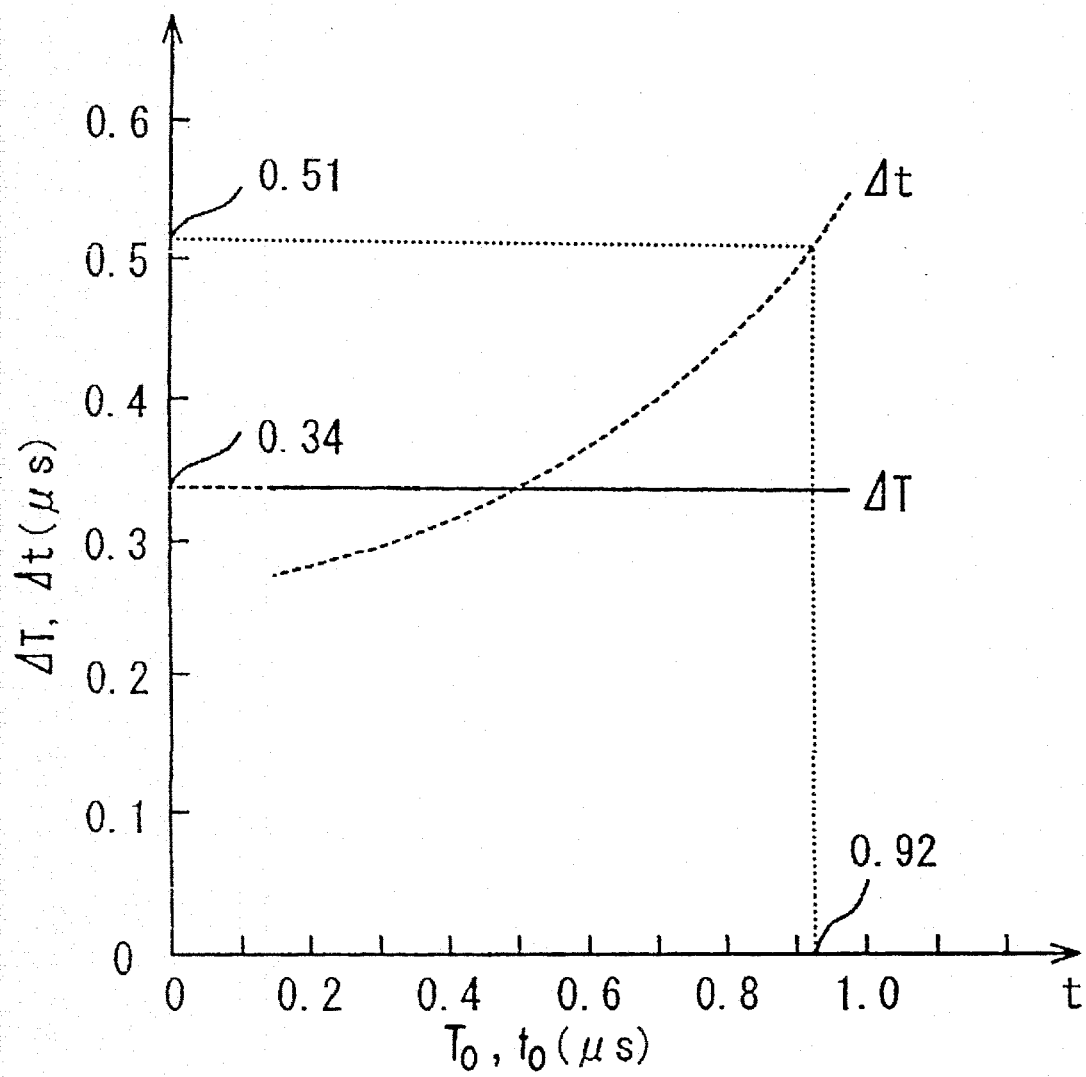
FIG. 4 shows a graph of characteristics indicating error due to noise versus timing of the noise in the prior art and the embodiment of the invention shown in FIG. 1.

Referring FIG. 4, a dashed line represents the variance of the time differential $\Delta T$ with relation to $T_0$, the time at which a noise spike occurs, where $\Delta T$ corresponds to possible variance in the output of the limiting amplifier. The graph is based on conditions where the supply voltage E is 5.0 V, the magnitude of the noise spike $\Delta E$ is ±0.5 V, the threshold voltage $V_T$ is 3.5 V, and the RC time constant is adjusted so that the time delay is 1.2 μs without noise. The time differential $\Delta T$ increases from less than 0.3 μs where the noise spike occurs at $T_0 = 0.2$ μs to 0.51 μs where the noise spike occurs at $T_0 = 0.92$ μs. Thus, a set up time delay difference of 0.52 μs is required in such a conventional circuit to ensure that false alarms are sufficiently avoided. Therefore, the conventional circuit cannot detect bodies at distances greater than is required to increase the delay time of the first integrator 72 an amount equal to 0.52 μs.

Figure 1:
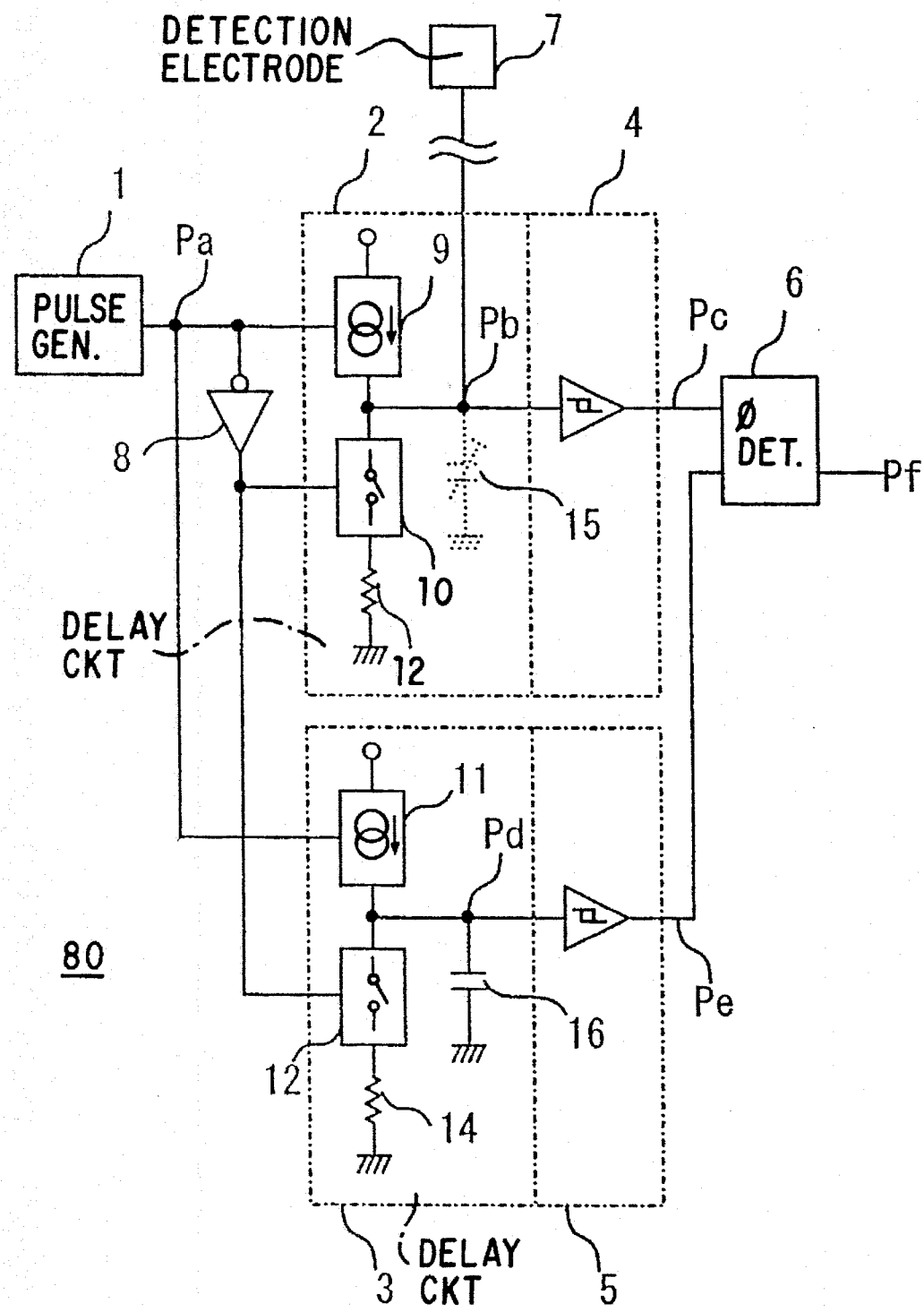
FIG. 1 shows a schematic diagram of an embodiment of a proximity sensor of the present invention.

Referring to FIG. 1, a schematic of an embodiment of the present invention shows a proximity sensor 80 having a pulse generator 1 and first and second delay circuits, 2 and 3, having output signals Pb and Pd, respectively. The output signals Pb and Pd are applied respectively to first and second limiting amplifiers, or Schmitt triggers, 4 and 5. The function of the Schmitt triggers, 4 and 5, is to produce a squared off digital wave form signal from input signals which are ramp shaped. It is realized that various devices may serve this purpose, including comparators with feedback to effect a Schmitt trigger function. Therefore, the label Schmitt trigger is used merely as a common example of one possible implementation of the embodiment of the invention and are in no way limits the scope of the invention. Output signals Pc and Pe of the first and second Schmitt triggers, 4 and 5, are applied to a phase detector 6 which functions as a phase discriminator indicating which one of the signals Pe and Pc has an earlier rising edge.

The first and second delay circuits, 4 and 5, are of similar construction with the exception that the second delay circuit 3 has a capacitor 16 while the first delay circuit 2 has a detection electrode 7 which has an electrostatic capacitance 15 represented by a phantom line capacitor. First and second constant current sources, 9 and 11, are each controlled by a pulse generator output Pa. Upon receiving a high input the first and second constant current sources, 9 and 11, turn on and pump current into the electrostatic capacitance 15 and the capacitor 16, respectively. First and second switches, 10 and 12, are controlled by an output from an inverter 8, which is the inversion of the output Pa, closing when receiving a high input. When the constant current sources, 9 and 11, are off, the switches 10 and 12 are on and charge stored on the electrostatic capacitance 15 and the capacitor 16 dissipates to ground through respective resistors 12 and 14.

Figure 2:
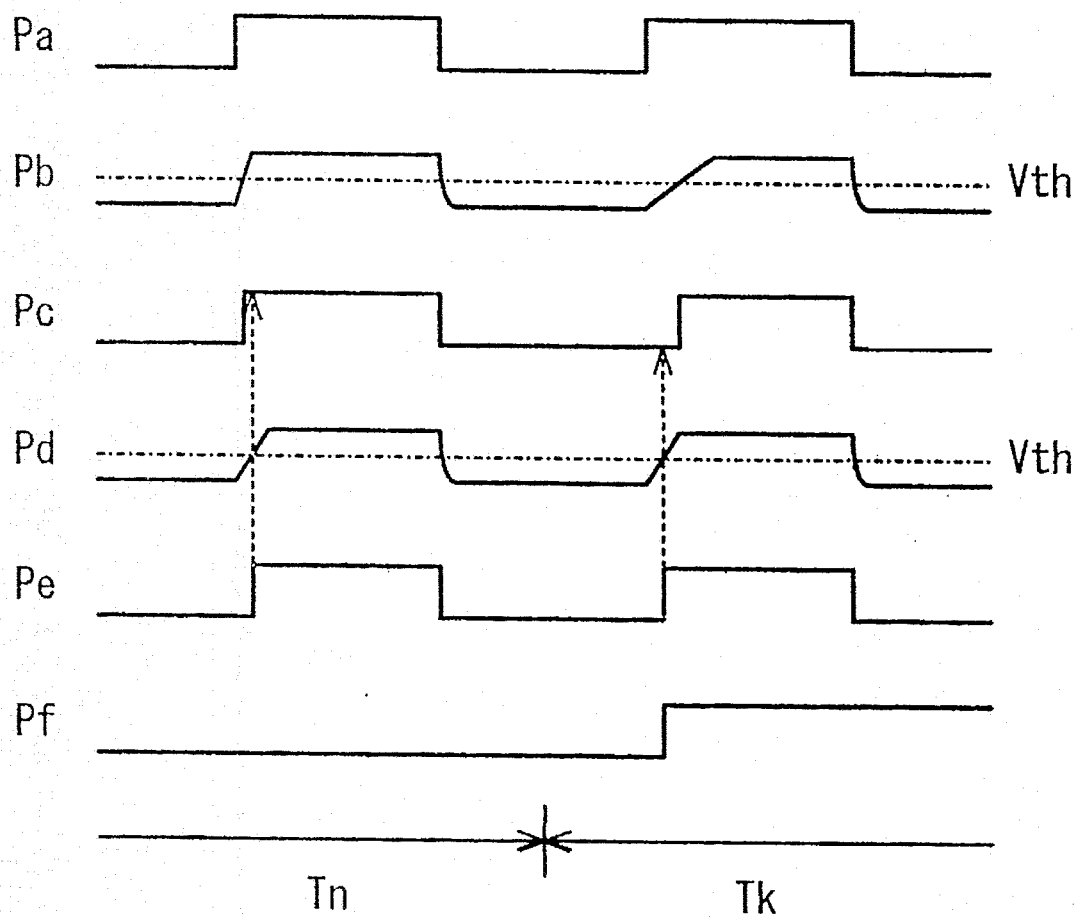
FIG. 2 shows a signal timing diagram of signals produced by the embodiment of FIG. 1.

Referring to FIG. 2, a timing diagram indicates wave form states during a standby period Tn when no object is detected and an active period Tk during which proximity of an object to the detection electrode 7 triggers a change in state of output Pf of the phase detector 6. In the standby state, the time delay of the second delay circuit 3 exceeds that of the first delay circuit resulting in the rising edge of first Schmitt trigger 4 output Pc occurring before the rising edge of the second Schmitt trigger 5 output Pe. While both the first and second current sources, 2 and 3, are simultaneously turned on, the rate of voltage build up on the electrostatic capacitance 15 is greater than on the capacitor 16 resulting in the slope of the output Pb being greater than that of the output Pd. Thus, the output Pf of the phase detector 6 is low.

The functioning of the proximity sensor 80 in a state where a body proximate the detection electrode 7 is detected is illustrated by the period Tk of the timing diagram of FIG. 2. An increase in the electrostatic capacitance 15 caused by the presence of the body results in the slope of the output Pb decreasing below that of the output Pd of the second delay circuit 3. Hence, the delay of the first delay circuit 2 becomes greater than that of the second delay circuit 3 and the second Schmitt trigger 5 output Pe goes high before the output Pc of the first Schmitt trigger 4. This inversion of sequence results in the phase detector output Pf going high indicating the presence of an object.

Figure 3:
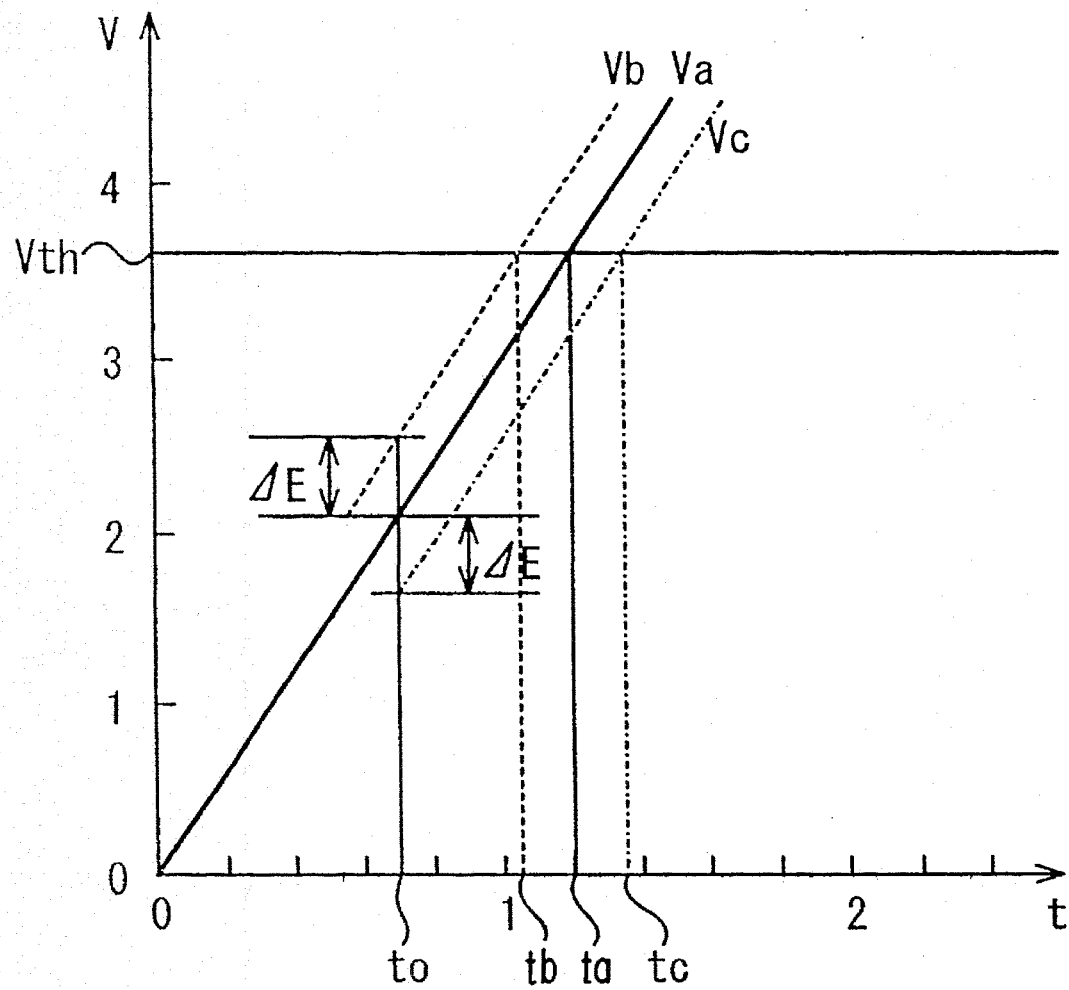
FIG. 3 shows a graph of an output characteristic of a delay circuit of the embodiment of the present invention shown in FIG. 1.

Referring to FIG. 3 in conjunction with FIG. 1, if the electrostatic capacitance 15 has a capacitance C, the constant current source 9 delivers a current I, and t represents the elapsed time from the output Pa going high, then the voltage $v_{cap}$ across the electrostatic capacitance 15 and comprising the output Pb may be expressed as a function of time by the following equation (5):

$$v_{cap} = It/C \qquad (5).$$

Thus, where the rate of charging in the first delay circuit 2 has the capacitor voltage $v_{cap}$ exceeding the threshold voltage $V_{th}$ of the Schmitt trigger 4 at an elapse time of $t_a$ following the rising edge of the pulse generator output Pa, the output signal Pc is represented by the voltage characteristic $v_a$ of FIG. 3. Voltage characteristics $v_b$ and $v_c$ represent the effect of a noise spike of a level $\pm\Delta E$ occurring at time $t_0$ upon voltage characteristic $v_a$. The resultant delay times are then $t_b$ and $t_c$, with a total range error of $t_c-t_b$ equal to $\Delta t$. Delays $t_b$ and $t_c$ are given by the following formulas (6,7):

$$t_b=C(V_{th}-\Delta E)/I \qquad (6),$$

and $$t_c=C(V_{th}+\Delta E)/I \qquad (7).$$

Thus, $t_b$ and $t_c$ are dependent upon only the threshold voltage $V_{th}$ and the level of the noise spike $\Delta E$ and do not depend upon the timing of the noise spike $\Delta E$.

Referring again to FIG. 4, the timing error $\Delta t$ is shown in comparison to the timing error $\Delta T$ of the conventional proximity circuit 70. The data represents both the proximity circuit 80 of the present invention and the convention proximity circuit 70 having the same supply voltage 5.0 V, noise spike magnitude $\Delta E$ equal to 0.5 V, and time constant with each circuit charging to the threshold voltage $V_{th}$, 3.5 V, in 1.2 µs in the absence of noise. The timing error $\Delta t$ remains fixed at 0.34 µs independent of the timing of the arrival of the noise spike. Thus, where the maximum timing error $\Delta T$ of the conventional proximity sensor 70 is 0.51 µs at 0.92 µs into the integration period, the timing error $\Delta t$ of the proximity sensor 80 of the present invention remains at 0.34 µs. Therefore, less delay is required to effect the standby operation allowing smaller changes of capacitance to be sensed and thereby extending the range of detection of the proximity sensor 80. Alternatively stated, it becomes possible to construct a sensor for which malfunctioning due to noise becomes less likely when using an electrostatic sensor for obtaining fixed distance detection.

It is realized that in an alternative embodiments of the present invention, the capacitors of the delay circuits may be fully charged when the pulse generator output Pa goes high, at which time constant current sources are used to discharge the capacitors to a given threshold voltage. Additionally, the delays and charging rates of the delay circuits may be varied by adding capacitors in parallel with the illustrated capacitances, the electrostatic capacitance 15 and the capacitor 16.

Figure 5:
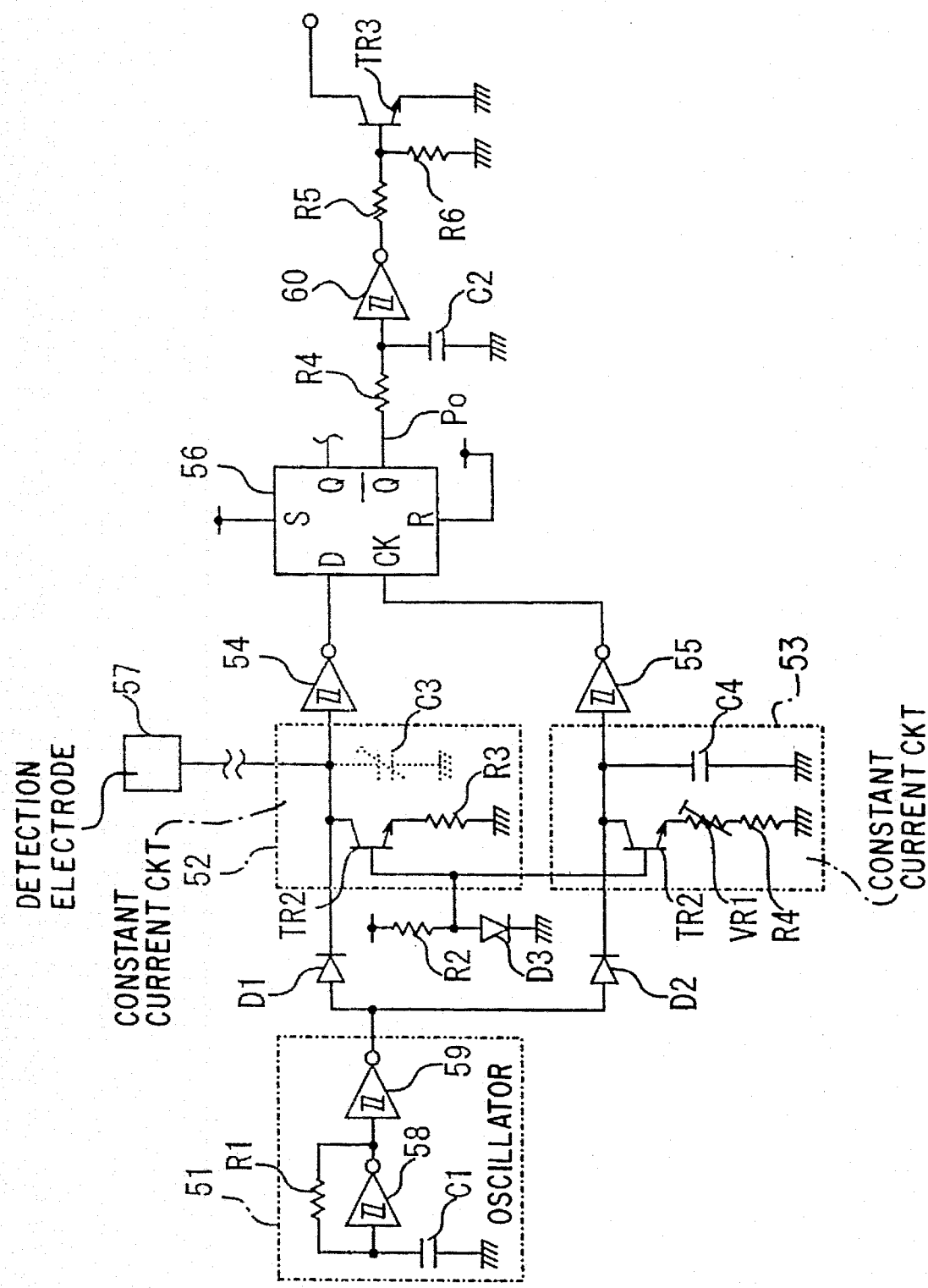
FIG. 5 shows a schematic diagram of another embodiment of the present invention.

Referring to FIG. 5, an alternative embodiment of the present invention is shown wherein a proximity sensor 90 having an oscillator circuit 51, producing square pulses, which includes two inverting Schmitt triggers 58 and 59 and a capacitor C1 and resistor R1 for setting the frequency of oscillation. Output pulses of the oscillator 51 are applied to anodes of diodes D1 and D2 through which an electrostatic capacitance C3, of a detection electrode 57, and a capacitor C4 are charged. An electrostatic capacitor-type converter is comprised of the detection electrode 57 and the electrostatic capacitance C3. When the output pulse of the oscillator 51 goes low, the electrostatic capacitance C3 and the capacitor C4 are discharged through first and second constant current sources 52 and 53, respectively.

The first constant current circuit 52 includes a transistor TR1, a resistor R3, and a resistor R2 and diode D# connected to a base of the transistor TR1. The second constant current circuit 53 includes a transistor TR2, resistor R4, variable resistor VR1 and the resistor R2 and diode D3 connected to a base of the transistor TR2. Thus, a first delay circuit is comprised of the first constant current source 52, the detection electrode 57 and a first Schmitt trigger 54 while a second delay circuit is comprised of the second constant current circuit 53, the capacitance C4, and a second Schmitt trigger 55. Similar to the above embodiments, the delay periods of the first and second delay circuits are adjusted by varying the capacitances C3 and C4. Alternatively, it is realized that the capacitor C4 may be replace by a detection electrode which would then serve as a reference. Such an approach may be used in detecting whether a body is closer to the detection electrode of either the first or second delay circuit.

A D-type flip-flop receives an output from the first delay circuit in a D input and an output from the second delay circuit in a clock input CK. In a standby mode, where there is no object near the detection electrode 57, an output Po at the $\overline{Q}$ output is low indicating that the amount of delay provided by the second delay circuit is greater than that of the first delay circuit. However, when an object is proximate the detection electrode 57, the electrostatic capacitance increases and the delay of the first delay circuit surpasses that of the second delay circuit. The output Po of the D flip-flop 56 then goes high to indicate the shifting of delays and the presence of an object within a detection range. The variable resistor VR1 allows adjustment of the delay of the second delay circuit.

The emitters of the transistors TR1 and TR2 provide a constant current through their respective emitter resistors R3 and VR1 and R4 which is drawn from their respective capacitances C3 and C4. Thus, linear discharge is effected. In order to minimize the effects of temperature changes in emitter base potentials, the transistors TR1 and TR2 are compensated for by the diode D3. Current feedback of the constant current circuits 52 and 53 ensures a stable current. When discharging of capacitances C3 and C4 is complete, the extent of current feedback is controlled so that this potential is maintained.

A resistor $R_f$ and a capacitor $C_f$ comprise a filter at the output $\overline{Q}$ of the D flip-flop 56 which serves to suppress outputs due to noise glitches or ringing. The output of the filter is supplied to a third Schmitt trigger 60 which drives output pull-down transistor TR3 via resistors R5 and R6.

The present invention provides integration circuits wherein a charge state of capacitances is altered by constant current circuits so that timing based irregularities in noise are removed. As the above embodiments illustrate, the constant current circuits may either charge or discharge the capacitances of the delay circuits, functioning as either sources or sinks. Due to the regularity of noise in these embodiments, the possible level of timing error does not reach the levels common in the prior art where timing error was dependent upon the timing of a noise spike. Thus, a smaller delay difference between the delay circuits of the present invention may be set than was possible in the prior art, and hence, the detection range of the proximity sensor is thereby enhance. Additionally, the lower noise present in the present invention provides for more reliable operation even in short range proximity detectors.

Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A proximity detector comprising:
   a pulse generator;

first and second delay circuits receiving an output of said pulse generator and having first and second capacitances respectively;

an electrostatic capacitance varying converter connected to at least one of said first and second delay circuits to vary a delay of said at least one delay circuit by varying a respective one of said first and second capacitances;

said first and second delay circuit each having a constant current circuit, controlled by said pulse generator, for changing a set state of charge on said first and second capacitances, respectively, in a substantially linear manner; and a phase discrimination circuit for detecting a phase difference between outputs of said first and second delay circuits.

2. The proximity sensor of claim 1 wherein said first and second constant current circuits are constant current sources.

3. The proximity sensor of claim 1 wherein said first and second constant current circuits are constant current sinking circuits.

4. The proximity sensor of claim 1 further comprising:

said first and second delay circuits including first and second switches controlled by said pulse generator;

said first and second switches applying a potential to said first and second capacitances to set said first and second capacitance at said set state of charge.

5. The proximity sensor of claim 1 wherein said constant current circuits are controllable by the output of said pulse generator.

6. The proximity sensor of claim 1 wherein said constant current circuits are temperature compensated.

7. A proximity detector comprising:

a pulse generator producing a pulse output;

first and second capacitances;

said first capacitance including a detection electrode having a capacitance dependent upon a proximity of objects thereto;

means for setting said first and second capacitances to a fixed state of charge in response to said pulse output being in a first state;

means for linearly altering said fixed state of charge on said first and second capacitances; and means for detecting a difference between a first rate of altering said charge on said first capacitance and a second rate of altering said charge on said second capacitance.

8. The proximity sensor of claim 7 wherein said means for altering includes first and second current sources for supplying current to said first and second capacitances respectively.

9. The proximity sensor of claim 7 wherein said means for altering includes first and second current sinks for draining current from said first and second capacitances respectively.

* * * * *